United States Patent
Hébert (10) Patent No.: US 7,786,837 B2
(45) Date of Patent: Aug. 31, 2010

(54) SEMICONDUCTOR POWER DEVICE HAVING A STACKED DISCRETE INDUCTOR STRUCTURE

(75) Inventor: François Hébert, San Mateo, CA (US)

(73) Assignee: Alpha and Omega Semiconductor Incorporated

(*) Notice: Subject to any disclaimer, the term of this patent is extended or adjusted under 35 U.S.C. 154(b) by 380 days.

(21) Appl. No.: 11/818,219

(22) Filed: Jun. 12, 2007

(65) Prior Publication Data

US 2008/0309442 A1    Dec. 18, 2008

(51) Int. Cl.
*H01F 5/00*     (2006.01)
*H01F 27/06*    (2006.01)
*H01F 27/02*    (2006.01)
*H01F 27/29*    (2006.01)
*H01L 23/48*    (2006.01)
*G05F 1/00*     (2006.01)

(52) U.S. Cl. .................. 336/200; 336/65; 336/83; 336/192; 257/738; 257/768; 323/222

(58) Field of Classification Search .................. None
See application file for complete search history.

(56) References Cited

U.S. PATENT DOCUMENTS

| | | | |
|---|---|---|---|
| 6,535,095 B2* | 3/2003 | Aoki et al. ................ 336/83 |
| 6,624,921 B1* | 9/2003 | Glenn et al. ............... 359/291 |
| 6,747,538 B2* | 6/2004 | Kuwata et al. ............. 336/83 |
| 6,825,746 B2* | 11/2004 | Otsuka et al. ............. 336/83 |
| 7,230,316 B2* | 6/2007 | Yamazaki et al. .......... 257/531 |
| 7,345,563 B2* | 3/2008 | Pavier ...................... 336/200 |
| 7,460,000 B2* | 12/2008 | Kudo et al. ................ 336/200 |
| 2005/0230828 A1* | 10/2005 | Wu .......................... 257/738 |
| 2006/0038651 A1* | 2/2006 | Mizushima et al. ........ 336/83 |
| 2007/0090912 A1* | 4/2007 | Lee .......................... 336/200 |
| 2007/0275506 A1* | 11/2007 | Yamazaki et al. .......... 438/118 |

* cited by examiner

*Primary Examiner*—Elvin G Enad
*Assistant Examiner*—Mangtin Lian
(74) *Attorney, Agent, or Firm*—Jingming Cai; Schein & Cai LLP (57) ABSTRACT

A power device includes a discrete inductor having contacts formed on a first surface of the discrete inductor and at least one semiconductor component mounted on the first surface of the discrete inductor and coupled to the contacts. The discrete inductor further includes contacts formed on a second surface opposite the first surface and routing connections connecting the first surface contacts to corresponding second surface contacts. The semiconductor components may be flip chip mounted onto the discrete inductor contacts or wire bonded thereto.

26 Claims, 8 Drawing Sheets

SEMICONDUCTOR POWER DEVICE HAVING A STACKED DISCRETE INDUCTOR STRUCTURE

BACKGROUND OF THE INVENTION

1. Field of the Invention

The present invention generally relates to semiconductor power devices and more particularly to a semiconductor power device having a stacked discrete inductor structure wherein at least one semiconductor component is stacked on, and electrically coupled to electrodes of, a discrete inductor. Routing connections formed on the discrete inductor provide additional contacts to the at least one semiconductor component.

2. Description of Related Art

It is well known to include a discrete inductor on the printed circuit board when implementing a power converter circuit. For example, the Analogic™TECH 1 MHz 400 mA Step-Down Converter (AAT1143) requires the use of a discrete inductor. Power converters implemented in this way suffer the disadvantages of having higher component cost and of requiring more printed circuit board space.

Discrete inductors co-packaged with power ICs and other components are also well known. For example, the LTM®4600 DC/DC power converter available from Linear Technology Corporation of Milpitas, Calif., includes a built-in inductor in a 15 mm×15 mm×2.8 mm package. The package disadvantageously uses valuable printed circuit board space.

It is further known to dispose an inductor on top of an integrated circuit die such as a power converter integrated circuit die. For example, power converters available from Enpirion of Bridgewater, N.J., include a MEMS-based inductor having a thick electroplated copper spiral coil sandwiched between two planar magnetic layers and disposed over an integrated DC-DC converter. To achieve high inductance, a large die (sometimes referred to as the Power-IC die) is required in order to support a relatively large MEMS inductor substrate and achieve the desired electrical characteristics (high inductance and low resistance). This results in a higher product cost since the cost of the Power-IC, on a per unit area basis, is much higher than that of the inductor. This also results in a large overall package size. Furthermore, complex processing is necessary in order to fabricate the planar magnetic layers and the overall inductor structure having appropriate electrical characteristics.

Chip scale processing techniques have been used to combine a power IC and an inductor in a single package. An inductor substrate forms the bulk of the chip scale package that includes an optimized planar spiral inductor as disclosed in commonly assigned U.S. patent application Ser. No. 11/729,311, filed on Mar. 27, 2007, and entitled "Chip Scale Power Converter Package Having an Inductor Substrate". A power IC is flipped onto the inductor substrate to form the chip scale power converter.

There remains a need in the art for a semiconductor power device requiring an inductor that achieves improved cost performance. The semiconductor power device preferably finds use in any application requiring an inductor. The semiconductor device also preferably finds use in power conversion applications such as buck, boost, and buck-boost converters and power regulation. The semiconductor power device further preferably uses existing high performance discrete power inductors co-packaged with a semiconductor component such as a power management IC and other discrete components such as field effect transistors and diodes. The semiconductor power device is preferably cost effective and has a small form factor.

SUMMARY OF THE INVENTION

The semiconductor power device having a stacked discrete inductor structure in accordance with the invention minimizes overall assembly and packaging costs by dispensing with the need for a separate substrate or lead-frame. In one aspect of the invention, a power device includes a discrete inductor having leads electrically coupled to the inductor electrodes and wrapping around a periphery of the discrete inductor. The leads allow for the stacking and electrical connection of semiconductor components upon a top surface of the discrete inductor. Contacts and routing connections formed on the top surface and wrapping around a periphery of the discrete inductor provide additional contacts for the stacked semiconductor components. The semiconductor components may be flip chip mounted onto the discrete inductor leads and contacts and routing connections or wire bonded thereto.

In accordance with another aspect of the invention, a wire-wound style low-profile and small dimension discrete inductor having a magnetic core structure has patterned electrodes formed thereon to route electrical signals from a stacked integrated circuit or circuits mounted on a surface of the discrete inductor by flip chip mounting techniques.

In accordance with another aspect of the invention, a wire-wound style low-profile and small dimension discrete inductor having a magnetic core structure has patterned electrodes formed thereon to route electrical signals from a stacked integrated circuit or circuits mounted on a surface of the discrete inductor by standard die attach techniques and wire bonding.

In accordance with yet another aspect of the invention, a multi-layer spiral style low-profile and small dimension discrete inductor has patterned electrodes formed thereon to route electrical signals from a stacked integrated circuit or circuits mounted on a surface of the discrete inductor by flip chip mounting techniques. The package can be flip chip mounted onto a printed circuit board or system level board with the mounted integrated circuit or circuits in contact with the printed circuit board or system level board for better heat sinking.

In accordance with another aspect of the invention, a multi-layer spiral style low-profile and small dimension discrete inductor has patterned electrodes formed thereon to route electrical signals from a stacked integrated circuit or circuits mounted on a surface of the discrete inductor using standard die attach techniques and wire bonding.

In accordance with yet another aspect of the invention, a multi-layer spiral style low-profile and small dimension discrete inductor has patterned electrodes formed thereon to route electrical signals from a stacked integrated circuit or circuits mounted on a surface of the discrete inductor. Discrete inductor electrodes are formed by means of interconnection vias extending either partially or entirely through a body of the discrete inductor.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

The semiconductor power device having a stacked discrete inductor structure of the invention provides a device that maximizes the overall device performance by combining the best possible and smallest possible integrated circuit with the best possible inductor structure. In this manner, the inventive device achieves a unique and efficient combination.

Figure 1:
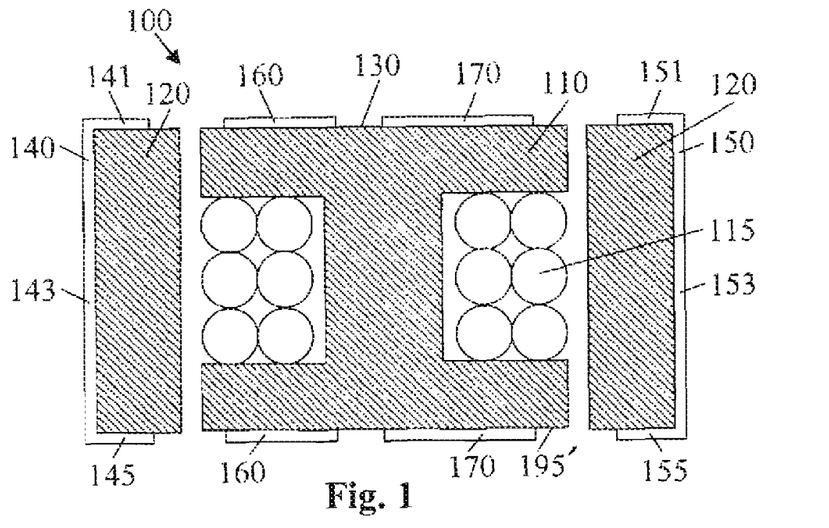
FIG. 1 is a schematic representation of a discrete inductor in accordance with the invention.

The present invention provides a semiconductor power device having a stacked discrete inductor structure. A discrete inductor generally designated 100 is shown in FIG. 1 and includes a drum core 110 (made of magnetic material such as ferrites) and a coil of wire 115 (typically low resistance copper) wound there around. A sleeve core 120 (made of magnetic material such as ferrites) surrounds the drum core 110. Representative low profile inductors include the Toko DE2812C having dimensions of 3.0 mm×3.2 mm square and 1.2 mm height and the Taiyo NR3012T.

Standard commercially available inductors typically have only two electrodes disposed on opposite sides of the inductor. To provide contact between electrodes of the discrete inductor 100 and contacts of semiconductors stacked on a first surface 130 of the discrete inductor 100, inductor leads 140 and 150 are wrapped around opposite sides (peripheries) of the discrete inductor 100. Inductor lead 140 includes a top electrode contact portion 141, a side routing connection portion 143, and a bottom electrode contact portion 145 on a second surface 195' of the discrete inductor 100. Inductor lead 150 includes a top electrode contact portion 151, a side routing connection portion 153, and a bottom electrode contact portion 155 on the second surface 195'. In accordance with the characteristics of the semiconductor components stacked on the first surface 130 and the manner in which the semiconductor components are stacked, the top electrode contact portions 141 and 151 of leads 140 and 150 may be extended to cover a greater portion of the first surface 130 of the discrete inductor 100 than that shown in FIG. 1. Inductor leads 140 and 150 may comprise AgNiSn, or other conductive materials such as NiAu, Cu and Al.

Contacts and routing connections 160 and 170 are formed on the first surface 130 and wrap around the periphery of the discrete inductor 100 terminating at the second surface 195 opposite the first surface 130 thereof to provide additional contacts for the stacked semiconductor components. In accordance with the characteristics of the semiconductor components stacked on the first surface 130 and the manner in which the semiconductor components are stacked, additional contacts and formed on the first surface 130 may be patterned into die pads, wire bonding pads and ball grid array contact pads by electroplating, for example. Contacts and routing connections 160 and 170 are representative of patterned electrodes and one skilled in the art will recognize that additional contacts and routing connections may be provided depending upon the characteristics of the semiconductor components stacked on the first surface 130. For example, metal connections may be provided to connect the contacts from the first surface 130 to the contacts on the second surface 195 through vias as further described herein. Contacts and routing connections 160 and 170 may comprise AgNiSn or other conductive materials such as NiAu, Cu and Al.

A unique characteristic of the present invention is that connections from the stacked integrated circuit or circuits, and additional components if present, must reach the mounting surface upon which the stacked inductor structure will be placed. To achieve this, the contacts and routing connections 160 and 170 may wrap around the periphery of the discrete inductor 100 on multiple sides of the discrete inductor 100.

Figure 2:
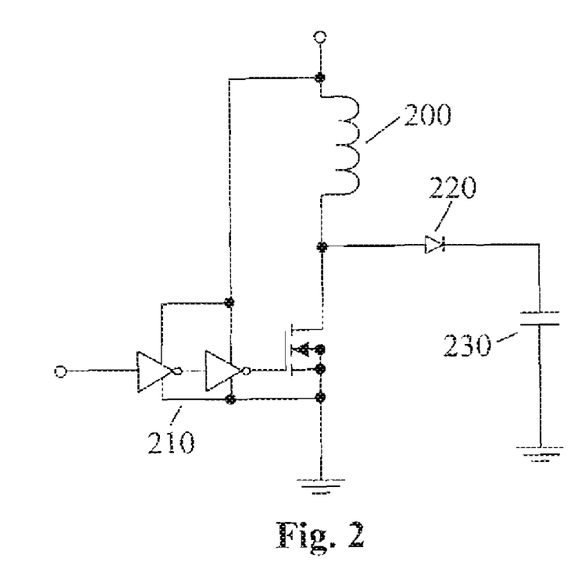
FIG. 2 is circuit diagram of a boost converter.
Figure 3:
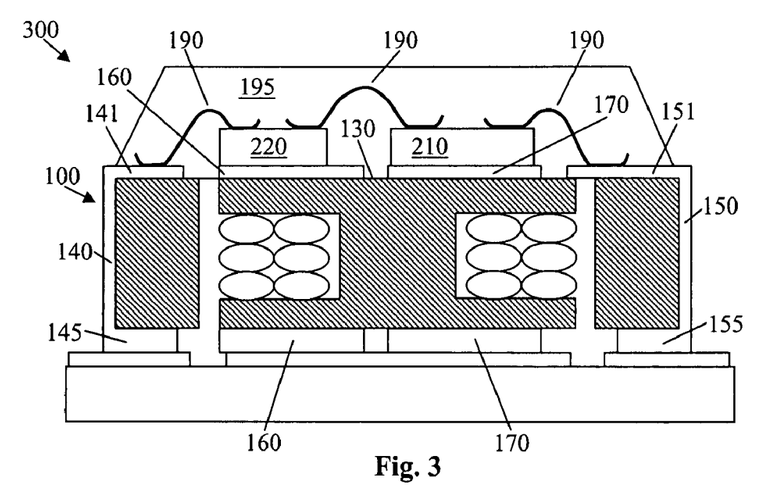
FIG. 3 is a side view of a schematic representation of a stacked discrete inductor structure implementing the boost converter in accordance with the invention.
Figure 4:
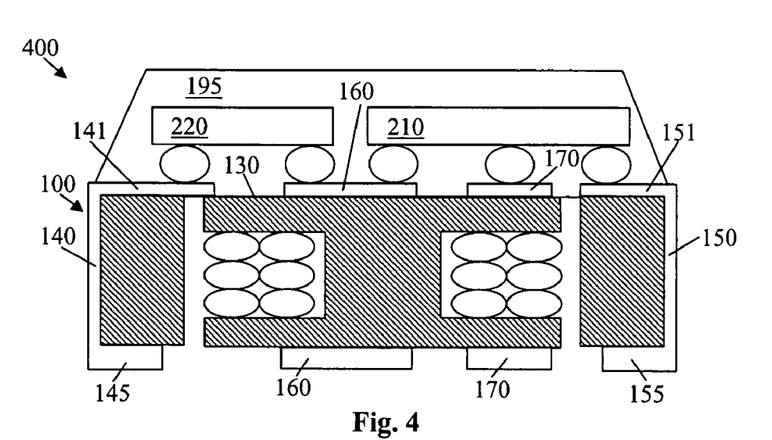
FIG. 4 is a side view of a schematic representation of an alternative embodiment of a stacked discrete inductor structure implementing the boost converter in accordance with the invention.
Figure 5:
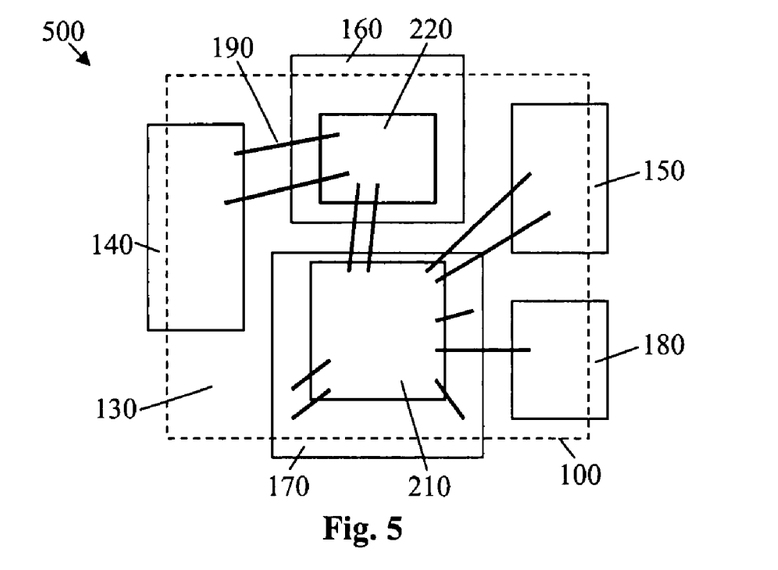
FIG. 5 is a top view of a schematic representation of an alternative embodiment of a stacked discrete inductor structure implementing the boost converter in accordance with the invention.

A preferred embodiment of the present invention includes a boost converter as shown in FIGS. 3, 4 and 5. A circuit diagram of the boost converter is shown in FIG. 2 and includes an inductor 200, control circuitry 210, Schottky diode 220, and external capacitor 230. In a first aspect of the preferred embodiment, and with reference to FIG. 3, the boost converter 300 includes the discrete inductor 100 having the control circuitry 210 and Schottky diode 220 stacked on the first surface 130 of the discrete inductor 100. The control circuitry 210 is coupled to contact and routing connection 170 to provide a ground connection. The Schottky diode 220 is coupled to contact and routing connection 160 to provide a cathode output. An additional contact and routing connection (not shown) provides a control signal input to the control circuitry 210. Connections between the Schottky diode 220, the control circuitry 210, inductor leads 140 and 150, and contact and routing connections are made through bond wires 190. An encapsulant 195 (mold compound) encapsulates the semiconductor components, the bonding wires 190, portions of the top electrode contact portions 141 and 151 and portions of the contact and routing connections.

In another aspect of the preferred embodiment, and with reference to FIG. 4, a boost converter generally designated 400 includes the discrete inductor 100 having the control circuitry 210 and Schottky diode 220 flip chip mounted on the first surface 130 of the discrete inductor 100. Contact and routing connection 160 serves to interconnect the Schottky diode 220 to the control circuitry 210 and contact and routing connection 170 provides a control signal input to the control circuitry 210.

In another aspect of the preferred embodiment, and with reference to FIG. 5, a boost converter generally designated 500 includes the discrete inductor 100 having the control circuitry 210 and Schottky diode 220 mounted on the first surface 130 of the discrete inductor 100. Schottky diode 220 is coupled to the contact and routing connection 160 to provide a cathode output. Control circuitry 210 is coupled to contact and routing connection 170 to provide a ground connection. A contact and routing connection 180 provides a control signal input to the control circuitry 210. Connections between the Schottky diode 220, the control circuitry 210, inductor leads 140 and 150, and contact and routing connections are made through bond wires 190.

Figure 6A:
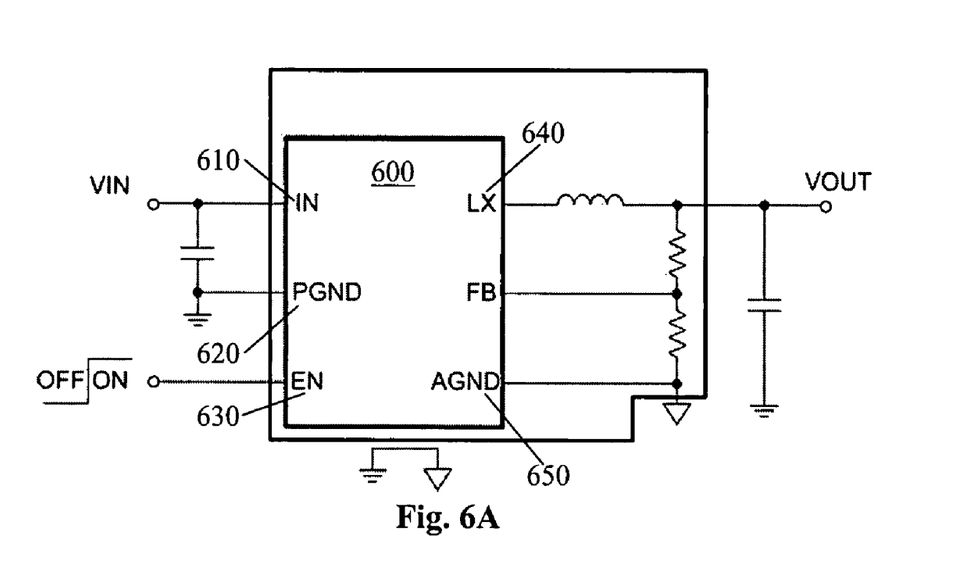
FIG. 6A is a circuit diagram of a buck converter.
Figure 6B:
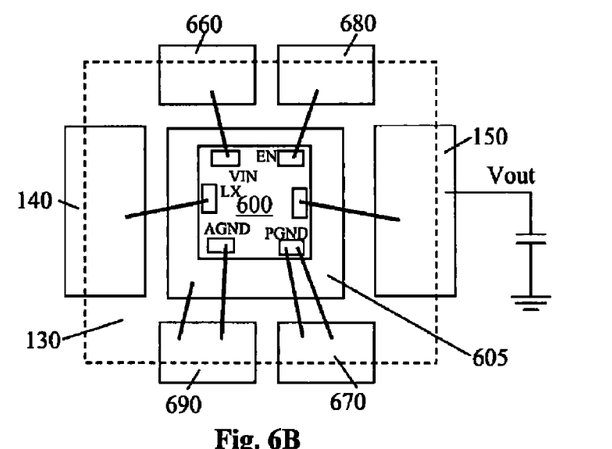
FIG. 6B is a top view of a schematic representation of a stacked discrete inductor structure implementing the buck converter in accordance with the invention.
Figure 7:
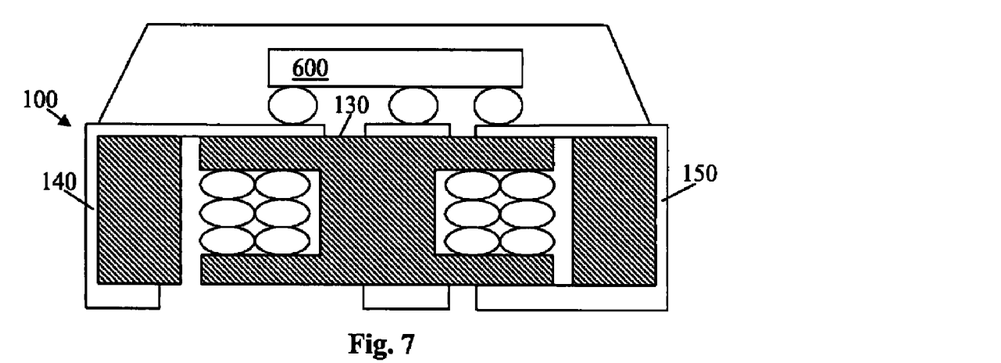
FIG. 7 is a side view of a schematic representation of an alternative embodiment of a stacked discrete inductor structure implementing the buck converter in accordance with the invention.
Figure 8:
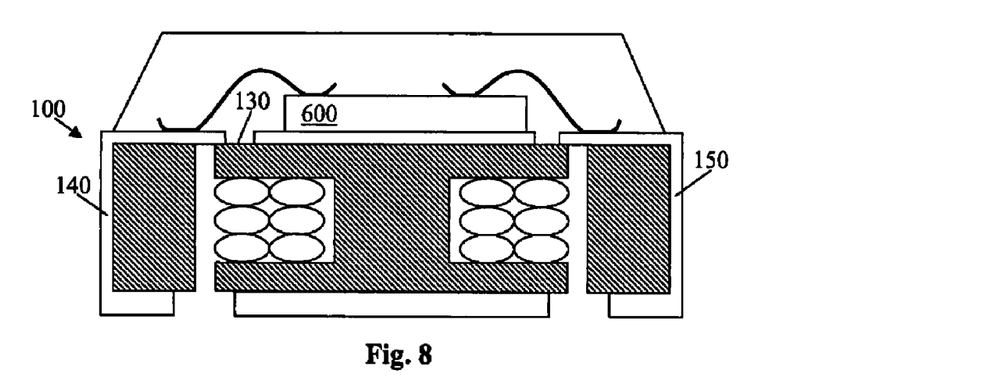
FIG. 8 is a side view of a schematic representation of an alternative embodiment of a stacked discrete inductor structure implementing the buck converter in accordance with the invention.

In accordance with another preferred embodiment of the invention, and with reference to FIGS. 6A, 6B, 7 and 8, a 5V buck converter for use in applications requiring less than 1 A is shown having a stacked discrete inductor structure. A power IC 600 typically having an area of 1×1.5 mm$^2$ is stacked on the first surface 130 of the discrete inductor 100 by flip chip mounting (FIG. 7) or wire bonding (FIGS. 6B and 8). With reference to FIG. 6B, the power IC 600 is mounted to a contact pad 605 formed on the first surface 130.

In this application, the power IC 600 requires five external connections including IN 610, PGND 620, EN 630, LX 640 and AGND 650 which are shown coupled to contact and routing connections 660, 670, 680, lead 140 and contact and routing connection 690 respectively (FIG. 6B). Contact pad 605 is electrically coupled to the contact and routing connection 690.

Figure 9:
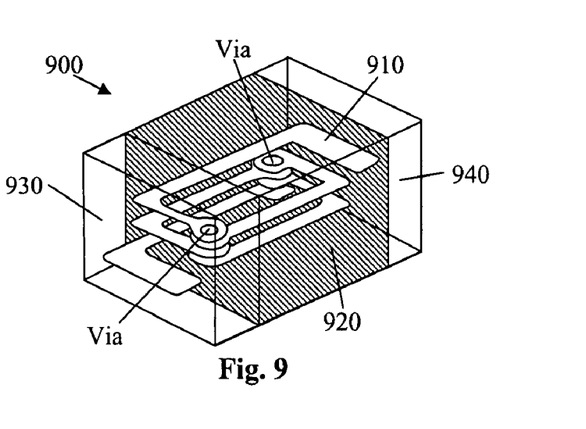
FIG. 9 is a schematic representation of a multi-layer discrete inductor.

In accordance with another preferred embodiment of the invention, semiconductor components are stacked on the surface of a discrete surface mount style multi-layer inductor. An example of multi-layer inductor is the Taiyo Yuden BK-series multi-layer chip inductor. As shown in FIG. 9, a multi-layer inductor 900 includes a relatively thin (less than 400 microns) structure having layers of conductors 910 (which can be silver, copper or other patterned metal) embedded in a ferrite material 920. Two end electrodes 930 and 940 provide contact to the inductor 900. The end electrodes preferably comprise AgNiSn, or other conductive materials such as NiAu, Cu and Al. A key benefit of multi-layer discrete inductor structure is that they can generally be thinner than discrete wire-wound inductors. The performance trade-off may be series resistance of the inductor, but this can be minimized by maximizing the thickness of the patterned metal on the layers of ferrite material 920.

Figure 10:
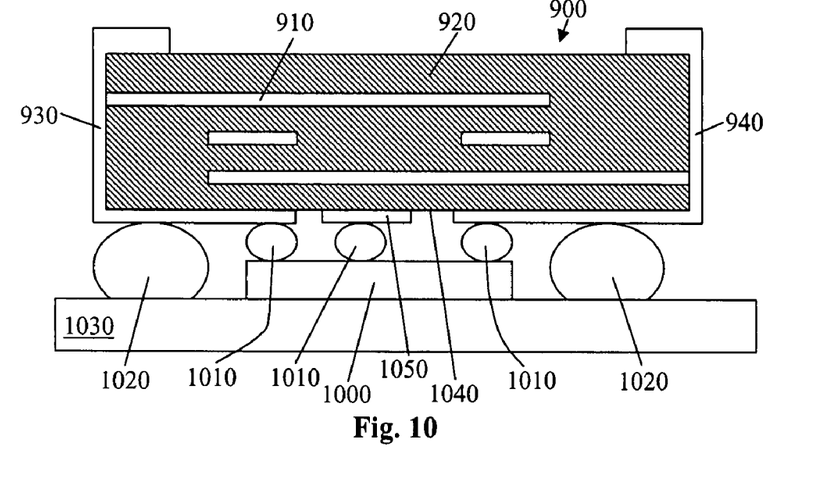
FIG. 10 is a side view of a schematic representation of a stacked discrete inductor structure using a multi-layer discrete inductor in accordance with the invention.
Figure 11:
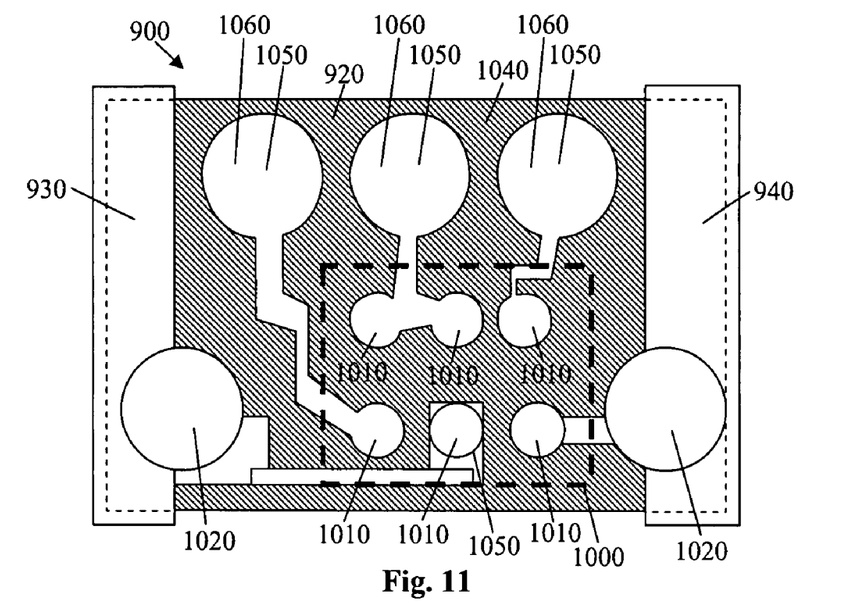
FIG. 11 is a top view of the schematic representation of the stacked discrete inductor structure of FIG. 10.

With reference to FIGS. 10 and 11, patterned contacts 1050 on a first surface 1040 of the discrete inductor 900 are formed by electroplating for example for providing contact to a semiconductor component 1000 flip chip mounted thereon. A plurality of small solder balls 1010 are formed in electrical contact with the patterned contacts 1050 for this purpose. One or more larger solder balls 1020 (two are shown in FIG. 10) provide connectivity between the end electrodes 930 and 940 and a printed circuit board 1030. Additional larger solder balls 1060 (FIG. 11) are formed in contact with other patterned contacts 1050 to provide connectivity between the patterned contacts 1050 and the printed circuit board 1030. The dashed line shown in FIG. 11 illustrates the placement of the semiconductor component 1000 on the surface 1040 of the discrete inductor 900. One surface of the semiconductor component 1000 may be exposed and substantially coplanar to the large solder balls 1020 and 1060 for direct connection to the printed circuit board 1030 as shown in FIG. 10.

In accordance with yet another preferred embodiment of the invention, and with reference to FIGS. 12, 13, 14 and 15, a discrete multi-layer inductor 1200 includes layers of conductors 1210 embedded in a ferrite material 1220. A semiconductor component 1230 is flip chip mounted to a first surface 1240 of the discrete inductor 1200. Connection to a printed circuit board 1250 is made by interconnection vias 1300 and 1330 or other routing connections. Molding material (not shown) may be applied to encapsulate the semiconductor component 1230 and the contacts formed on the first surface 1240 for protection thereof.

Figure 12:
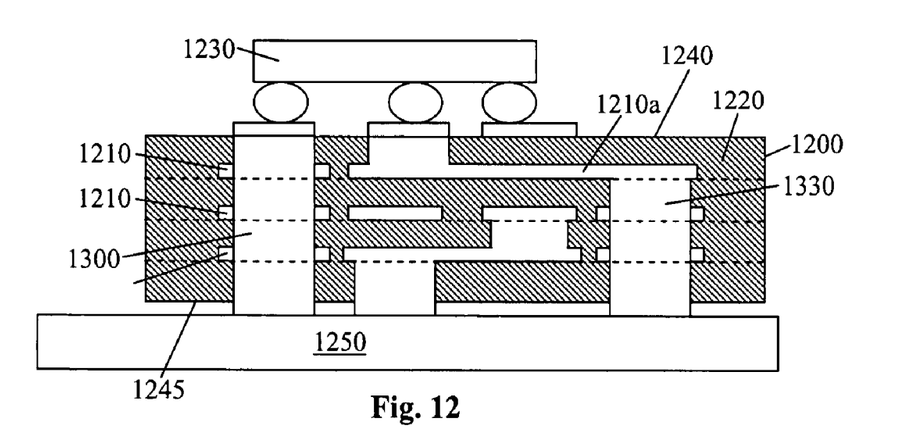
FIG. 12 is a schematic representation of an alternative embodiment of the stacked discrete inductor structure using a multi-layer discrete inductor in accordance with the invention.

The layered structure of the discrete multi-layer inductor 1200 advantageously provides for means by which one layer 1210 can be connected to other layers 1210 using interconnection vias such as vias 1300 and 1330. Through via 1300 connects three layers 1210 and extends from the first surface 1240 of the inductor 1200 to a second surface 1245 of the inductor 1200. Layers 1210 can also be routed within the inductor 1200 to provide connection to terminals of semiconductor components mounted upon the inductor 1200 as illustrated by layer 1210a.

Figure 13:
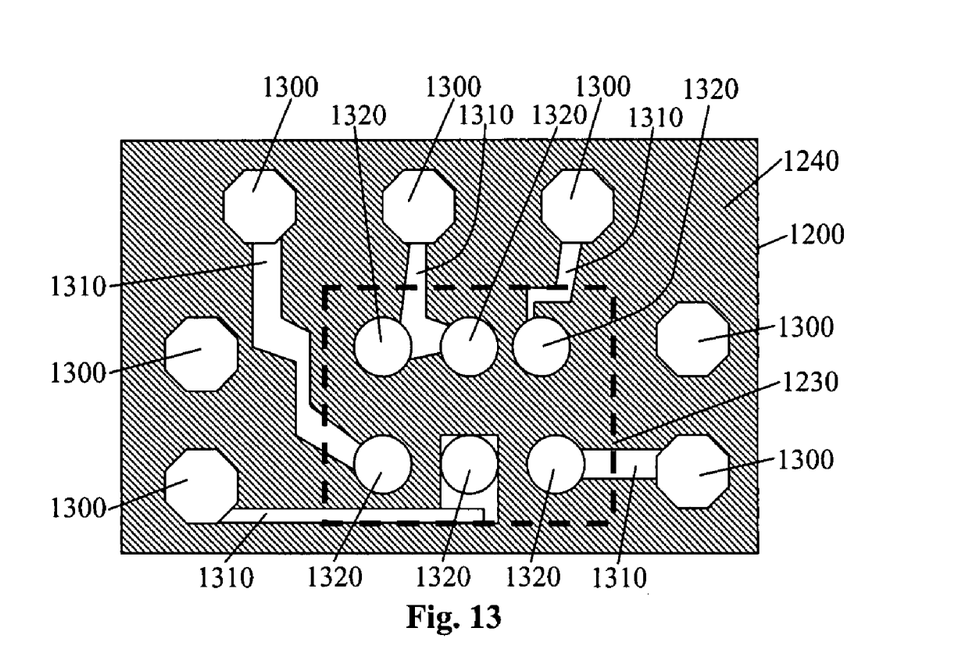
FIG. 13 is a top view of the schematic representation of the stacked discrete inductor structure of FIG. 12.
Figure 14:
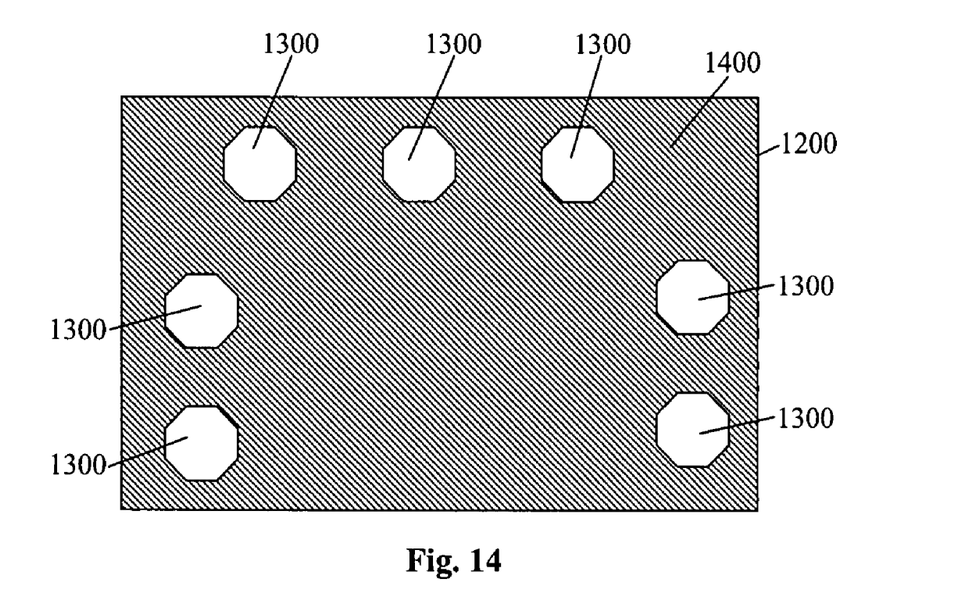
FIG. 14 is a bottom view of the schematic representation of the stacked discrete inductor structure of FIG. 12.

With particular reference to FIG. 13, patterned contacts 1310 on the first surface 1240 of the discrete inductor 1200 are formed for providing contact to the semiconductor component 1230 flip chip mounted thereon. A plurality of small solder balls 1320 are formed in contact with the patterned contacts 1310 for this purpose. A view of the vias 1300 exposed on a second surface 1400 of the discrete inductor 1200 is shown in FIG. 14.

Figure 15:
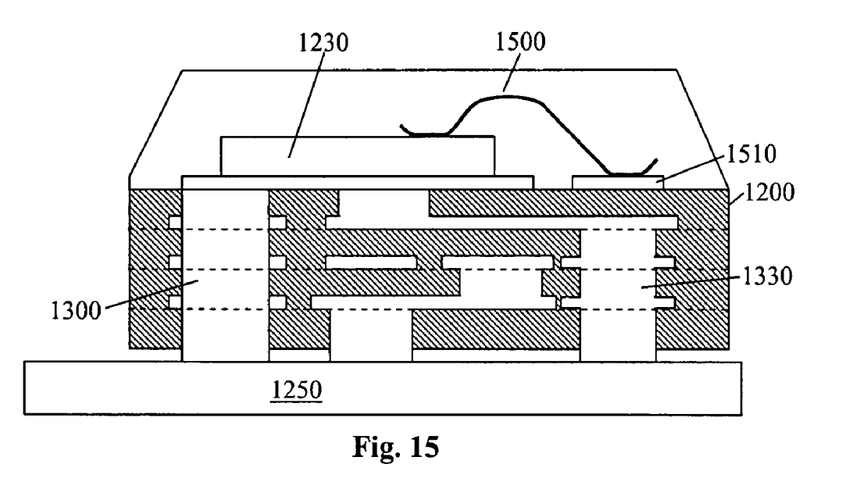
FIG. 15 is a schematic representation of an alternative embodiment of the stacked discrete inductor structure using a multi-layer discrete inductor in accordance with the invention.

In accordance with another aspect of the invention, and with reference to FIG. 15, the semiconductor component 1230 is wire bonded to patterned contacts 1510 by means of bond wires 1500.

It should be noted that the multi-layer discrete inductor structure can be configured differently to achieve optimal configurations for the stacked application described. For example, to minimize the overall thickness of the semiconductor power device package, fewer layers in the multi-layer discrete inductor 900, 1200 can be employed. A useful final product may have a 0.9 mm or less total thickness. This can be achieved by using a 0.15-0.2 mm power IC flip-chip mounted using 0.1-0.2 mm solder balls on a multi-layer inductor 900 with a 0.3-0.5 mm thickness.

The semiconductor power device in accordance with the invention reduces cost by eliminating the need for an additional substrate or lead frame. The device achieves the highest inductance performance by using standard high performance and optimized discrete inductors. The cost of the semiconductor component used is minimized since the semiconductor die can be made small. Additionally, the semiconductor power device of the invention does not require new processing technologies and uses existing standard assembly techniques.

The semiconductor power device in accordance with the invention provides for reduced Bill of Materials as well as lower cost achieved through minimizing overall assembly and packaging costs. In some preferred embodiments, the semiconductor power device also leaves the inductor undisturbed to maximize the inductor's performance. Finally, the semiconductor power device preferably provides a device having a 4×4 mm$^2$ footprint in portable applications of less than 1 A such as the 5V buck converter.

It is apparent that the above embodiments may be altered in many ways without departing from the scope of the invention. For example, in addition to the boost converter and the buck converter described, one skilled in the art will appreciate that other circuits may be implemented using the inventive structure including non-synchronous buck converters having NMOS high-side and Schottky diode low-side components integrated in the power IC or co-packaged outside of the power IC, synchronous buck converters having NMOS low-side and PMOS high-side components integrated in the power IC or co-packaged outside of the power IC, synchronous buck converters having NMOS low-side and NMOS high-side components integrated in the power IC or co-packaged outside of the power IC, buck-boost converters and any circuit requiring an inductor with a relatively high inductance in the hundreds of nano Henries to many micro Henries and low resistance in the 0.05 to 0.3 ohms range. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A semiconductor power device comprising:
a discrete inductor having contacts formed on a first surface of the discrete inductor;
at least one semiconductor component mounted on the first surface of the discrete inductor and coupled to the contacts, wherein the discrete inductor further comprises second contacts formed on a second surface opposite the first surface and routing connections connecting the contacts on the first surface to corresponding ones of the second contacts, wherein the routing connections are formed on a surface of the discrete inductor and wrap around a periphery of the discrete inductor, and the contacts, the second contacts, and the routing connections are formed as an electroplated layer on the discrete inductor; and
an encapsulant covering the at least one semiconductor component and the first surface contacts.

2. The semiconductor power device of claim 1, wherein the routing connections comprise through vias.

3. The semiconductor power device of claim 1, wherein the contacts and the routing connections comprise AgNiSn.

4. The semiconductor power device of claim 1, wherein the device is a boost power converter and the at least one semiconductor component includes a Schottky diode and a control circuitry.

5. The semiconductor power device of claim 4, wherein the Schottky diode and the control circuitry are flip chip mounted to the contacts.

6. The semiconductor power device of claim 4, wherein the Schottky diode and the control circuitry are wire bonded to the contacts.

7. The semiconductor power device of claim 1, wherein the device is a buck power converter and the at least one semiconductor component includes a power integrated circuit.

8. The semiconductor power device of claim 7, wherein the power integrated circuit is flip chip mounted to the contacts.

9. The semiconductor power device of claim 7, wherein the power integrated circuit is wire bonded to the contacts.

10. The semiconductor power device of claim 1, wherein the discrete inductor comprises a surface mount wire-wound discrete inductor.

11. The semiconductor power device of claim 1, wherein the discrete inductor comprises a multi-layer discrete inductor.

12. The semiconductor power device of claim 1, further comprising a patterned contact formed on the first surface of the discrete inductor connecting a first contact to a second contact on the first surface.

13. The semiconductor power device of claim 12, further comprising a small solder ball connecting the first contact to the semiconductor component and a large solder ball connected to the second contact, the large solder ball substantially coplanar to a surface of the semiconductor component.

14. The semiconductor power device of claim 13, wherein the surface of the semiconductor component coplanar to the large is exposed and mounts to a printed circuit board.

15. The semiconductor power device of claim 12, wherein the discrete inductor further comprises contacts formed on a second surface opposite the first surface and routing connections connect the first surface contacts to corresponding second surface contacts.

16. The semiconductor power device of claim 15, wherein the routing connections are formed on a surface of the discrete inductor and wrap around a periphery of the discrete inductor.

17. The semiconductor power device of claim 15, wherein the device is a boost power converter and the at least one semiconductor component includes a Schottky diode and a control circuitry.

18. The semiconductor power device of claim 17, wherein the Schottky diode and the control circuitry are flip chip mounted to the contacts.

19. The semiconductor power device of claim 17, wherein the Schottky diode and the control circuitry are wire bonded to the contacts.

20. The semiconductor power device of claim 15, wherein the device is a buck power converter and the at least one semiconductor component includes a power integrated circuit.

21. The semiconductor power device of claim 20, wherein the power integrated circuit is flip chip mounted to the contacts.

22. The semiconductor power device of claim 20, wherein the power integrated circuit is wire bonded to the contacts.

23. The semiconductor power device of claim 12, wherein the discrete inductor comprises a surface mount wire-wound discrete inductor.

24. The semiconductor power device of claim 12, wherein the discrete inductor comprises a multi-layer discrete inductor.

25. The semiconductor power device of claim 12, further comprising an encapsulant covering the at least one semiconductor component and the first surface contacts.

26. A discrete inductor comprising:
contacts formed on a first surface of the discrete inductor, the contacts including a ball grid array for flip chip connecting to at least one semiconductor integrated circuit;
second contacts formed on a second surface of the discrete inductor opposite the first surface, and routing connections connecting the contacts on the first surface to corresponding ones of the second contacts, wherein the routing connections are formed on a surface of the discrete inductor and wrap around a periphery of the discrete inductor, and the contacts, the second contacts, and the routing connections are formed as an electroplated layer on the discrete inductor; and
an encapsulant covering the at least one semiconductor integrated circuit and the contacts.

* * * * *